United States Patent
Huisman et al.

(10) Patent No.: US 9,130,553 B2
(45) Date of Patent: Sep. 8, 2015

(54) LOW/HIGH VOLTAGE SELECTOR

(71) Applicant: NXP B.V., Eindhoven (NL)

(72) Inventors: Bert Huisman, Wijchen (NL); Peter Christiaans, Nijmegen (NL); Thierry Jans, Uden (NL)

(73) Assignee: NXP B.V., Eindhoven (NL)

( * ) Notice: Subject to any disclaimer, the term of this patent is extended or adjusted under 35 U.S.C. 154(b) by 470 days.

(21) Appl. No.: 13/645,339

(22) Filed: Oct. 4, 2012

(65) Prior Publication Data

US 2014/0097686 A1 Apr. 10, 2014

(51) Int. Cl.
 *H03K 5/153* (2006.01)
 *H03K 5/24* (2006.01)
 *G01R 19/00* (2006.01)

(52) U.S. Cl.
 CPC .......... *H03K 5/2472* (2013.01); *G01R 19/0038* (2013.01); *H03K 2217/0018* (2013.01); *Y10T 307/50* (2015.04)

(58) Field of Classification Search
 CPC .................................................. G01R 19/0038
 USPC .................. 327/50, 58, 62, 63, 71, 77, 82
 See application file for complete search history.

(56) References Cited

U.S. PATENT DOCUMENTS

| | | | | |
|---|---|---|---|---|
| 4,460,837 A | * | 7/1984 | Anderson, Jr. | 327/68 |
| 4,626,707 A | | 12/1986 | Arita et al. | |
| 5,963,080 A | | 10/1999 | Miske et al. | |
| 6,040,718 A | * | 3/2000 | Henry | 327/71 |
| 2009/0134708 A1 | * | 5/2009 | Ryoo | 307/80 |
| 2009/0278571 A1 | | 11/2009 | Pietri et al. | |
| 2010/0315157 A1 | * | 12/2010 | Na et al. | 327/539 |
| 2011/0304381 A1 | | 12/2011 | Ku | |

OTHER PUBLICATIONS

Extended European Search Report for EP Patent Appln. No. 13185503.3 (Jan. 23, 2015).

* cited by examiner

*Primary Examiner* — William Hernandez

(57) ABSTRACT

A voltage selector circuit is described. The voltage selector circuit includes a first voltage input, a second voltage input, and a voltage comparison input. The voltage selector circuit also includes a first voltage selector connected to an output. The first voltage selector is configured to compare the first voltage input and the second voltage input to the voltage comparison input. The voltage selector circuit also includes a second voltage selector connected to the output. The second voltage selector is configured to compare the first voltage input to the second voltage input using an early trigger, such that the second voltage selector is configured to switch on before the first voltage selector switches off.

17 Claims, 4 Drawing Sheets

LOW/HIGH VOLTAGE SELECTOR

Analogue voltage switches that are over- and under-voltage tolerant include complimentary metal-oxide-semiconductor (CMOS) technology may ensure that the well of p-type transistors (PMOS) is always connected to the highest voltage potential, and that the well of the n-type transistors (NMOS) is always connected to the lowest voltage potential. In some cases, this may be achieved via a voltage selector circuit. Voltage selector circuits are able to select either a highest (most positive) or lowest (most negative) voltage signal from multiple input signals.

In various embodiments of conventional voltage selector circuits, such as the conventional voltage selector circuit 100 shown in FIG. 1, the conventional voltage selector circuit 100 includes a detection circuit 102. The conventional voltage selector circuit 100 shown receives three voltage input signals, including voltage input A, voltage input B, and a voltage comparison input 106. The conventional voltage selector circuit 100 is configured to output the highest value of the three input signals at the output 108 based on a comparison of the voltages at the detection circuit 102.

Embodiments of a circuit are described. In one embodiment, the circuit is a voltage selector circuit is described. The voltage selector circuit includes a first voltage input, a second voltage input, and a voltage comparison input. The voltage selector circuit also includes a first voltage selector connected to an output. The first voltage selector is configured to compare the first voltage input and the second voltage input to the voltage comparison input. The voltage selector circuit also includes a second voltage selector connected to the output. The second voltage selector is configured to compare the first voltage input to the second voltage input using an early trigger, such that the second voltage selector is configured to switch on before the first voltage selector switches off. Other embodiments of a circuit are also described.

Embodiments of a system are described. In one embodiment, the system includes a first voltage generator configured to generate a first voltage and a second voltage generator configured to generate a second voltage. The system also includes a voltage selector circuit. The voltage selector circuit includes a first voltage selector and a second voltage selector connected to an output of the voltage selector circuit. The first voltage selector is configured to compare the first voltage and the second voltage to a voltage comparison input. The second voltage selector circuit is configured to compare the first voltage to the second voltage using an early trigger. The second voltage selector is configured to switch on before the first voltage selector is switched off. Other embodiments of a system are also described.

Embodiments of a method are described. In one embodiment, the method is a method for selecting a voltage input. The method includes receiving a first voltage input, a second voltage input, and a voltage comparison input. The method further includes comparing the first voltage input and the second voltage input to the voltage comparison input at a first voltage selector. The first voltage selector is connected to an output. The method further includes comparing the first voltage input to the second voltage input at a second voltage selector using an early trigger. The second voltage selector is configured to switch on before the first voltage selector switches off. The second voltage selector is also connected to the output. Other embodiments of a method are also described.

Other aspects and advantages of embodiments of the present invention will become apparent from the following detailed description, taken in conjunction with the accompanying drawings, illustrated by way of example of the principles of the invention.

Throughout the description, similar reference numbers may be used to identify similar elements.

Figure 1:
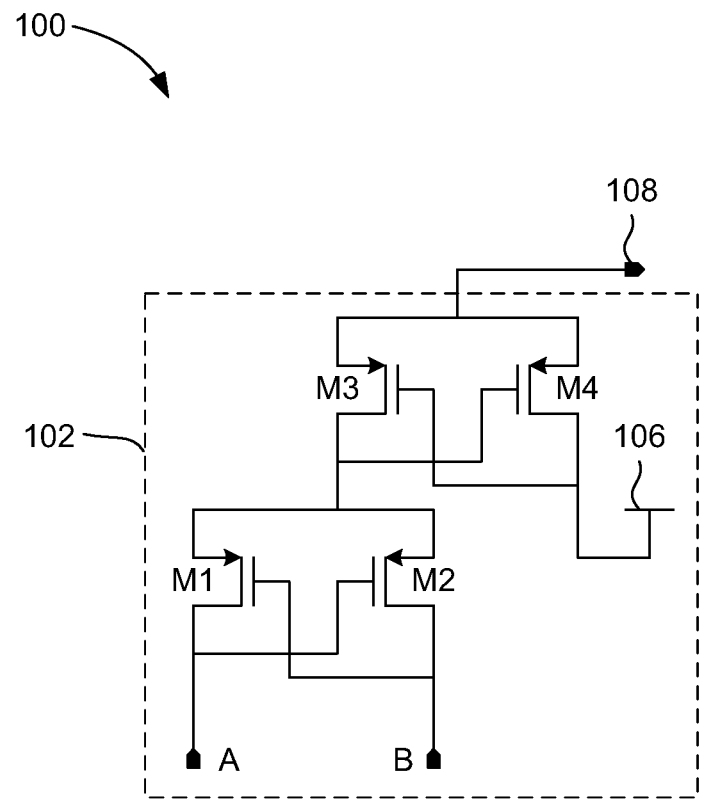
FIG. 1 depicts a schematic diagram of one embodiment of a conventional voltage selector circuit.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments present a system and method for selecting a voltage input from a plurality of voltage inputs. More specifically, the system receives the voltage inputs and compares the voltage inputs to each other to determine a highest or lowest voltage value from the voltage inputs and output the determined voltage value.

Conventional voltage selector circuits 100 may be capable of selecting the highest or lowest voltage input (depending on whether a NMOS components or PMOS components are used). However, when first and second voltage inputs are equal or substantially equal, or when the first or second voltage inputs are equal or substantially equal to the voltage comparison input, the detection circuit 102 of the conventional voltage selector circuit 100 may output a high ohmic value due to transistors in the detection circuit 102 being turned off and preventing current flow through the transistors to the output 108.

Consequently, a system that reduces the sensitivity of a voltage selector circuit for high ohmic values of the detection circuits may improve the operation of the voltage selector circuit and increase the accuracy of the voltage selector circuit in outputting the correct (highest or lowest) voltage value from the voltage inputs.

FIG. 1 depicts a schematic diagram of one embodiment of a conventional voltage selector circuit 100. The conventional voltage selector circuit 100 receives three signal inputs: a first voltage input, also referred to herein as voltage input A; a second voltage input, also referred to herein as voltage input B; and a voltage comparison input 106—also referred to herein as either a supply voltage or a ground input, depending on whether the conventional voltage selector circuit 100 is configured to select the highest or the lowest voltage value from the signal inputs. For a conventional voltage selector circuit 100 configured to select the highest voltage value of the three input signals using the detection circuit 102, the highest voltage value from voltage input A and voltage input B may be compared to a supply voltage. To select the lowest voltage value of the three input signals, the lowest voltage value from voltage input A and voltage input B may be compared to a ground signal.

If the voltage comparison input 106 is a supply voltage, when voltage input A is lower than voltage input B, transistor M2 conducts, and the voltage value into transistor M3 and at the gate of transistor M4 is the voltage value of voltage input B. If voltage input A is higher than voltage input B, transistor M1 conducts, and the voltage value into transistor M3 and at the gate of transistor M4 is the voltage value of voltage input A. If voltage input A is equal to voltage input B, the transistors M1 and M2 do not conduct, and the input to transistor M3 is a high ohmic input. Because the input to transistor M3 is high ohmic, transistor M3 and transistor M4 also do not conduct, and the output 108 of the conventional voltage selector circuit 100 is a high ohmic output. The high ohmic output may also be produced if the resulting voltage value from the comparison of voltage input A and voltage input B is equal to the voltage value of the voltage comparison input 106. The high ohmic output can cause problems in circuits connected to the output 108 of the conventional voltage selector circuit 100.

Figure 2:
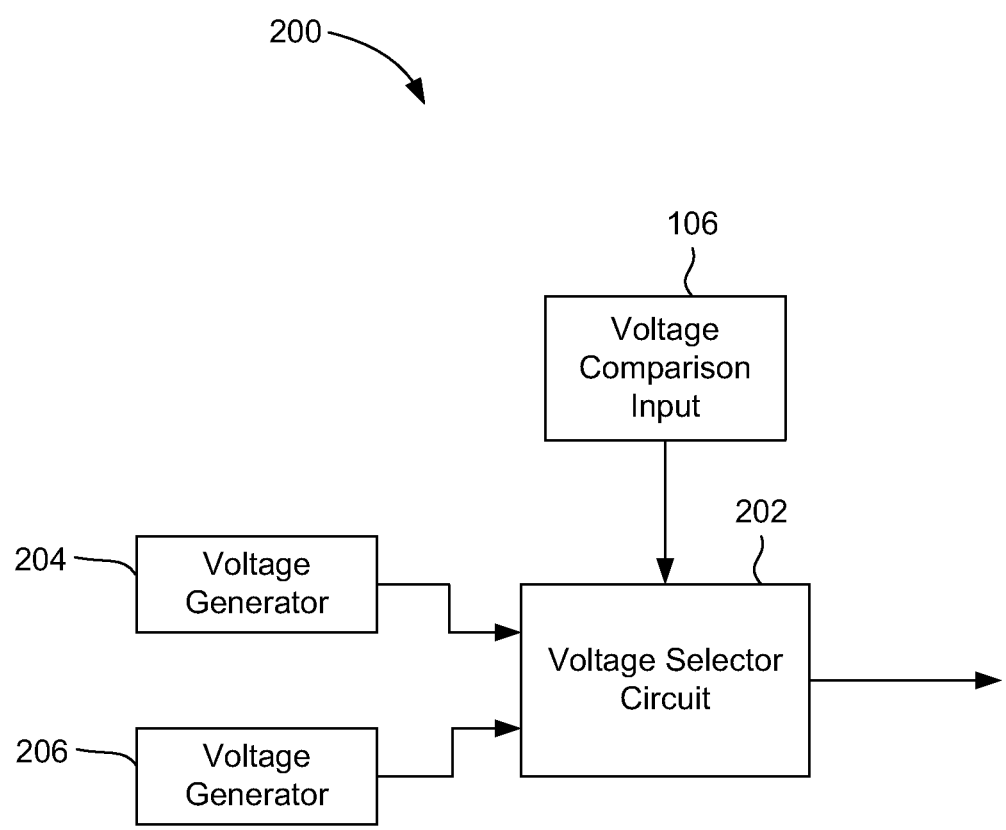
FIG. 2 depicts a block diagram of one embodiment of a system for selecting a voltage input from a plurality of voltage inputs.

FIG. 2 depicts a block diagram of one embodiment of a system 200 for selecting a voltage input from a plurality of voltage inputs. While the voltage selector circuit 202 is described herein in conjunction with the system 200 of FIG. 2, the voltage selector circuit 202 may be used in conjunction with any type of system.

In one embodiment, the system 200 includes a voltage selector circuit 202 configured to receive multiple inputs. The inputs may include voltage values from a first voltage generator 204 and a second voltage generator 206. The voltage selector circuit 202 may also receive an input from a voltage comparison input 106. The voltage comparison input 106 may include a supply voltage input and/or a ground input. The voltage generators 204, 206 may include any type of circuit configured to generate a specific voltage value to be input to the voltage selector circuit 202. In some embodiments, the system 200 may include more voltage generators 204, 206 than depicted in FIG. 2. The voltage selector circuit 202 may be configured to select from more than three voltage inputs. The system 200 may use more than one voltage selector circuit 202 to select from a variety of inputs. The system 200 may use a first voltage selector circuit 202 to select the highest voltage value from a set of three voltage inputs. The system 200 may use a second voltage selector circuit 202 to select the lowest voltage value from a set of three voltage inputs.

The voltage values output by the voltage generators 204, 206 may vary depending on the performance of the components used in the voltage generators 204, 206, as well as loading or other factors. Because the voltage values may fluctuate, the voltage selector circuit 202 may be configured to select the highest (or lowest) voltage value produced by the voltage generators 204, 206 to select the highest (or lowest) voltage value. In one embodiment, the output 108 of the voltage selector circuit 202 is used to maintain the wells of the PMOS transistors at the highest voltage value generated by the voltage generators 204, 206 or the supply voltage. The output 108 of the voltage selector circuit 202 may alternatively be used to maintain the wells of the NMOS transistors at the lowest voltage value generated by the voltage generators 204, 206 or a ground input.

Figure 3:
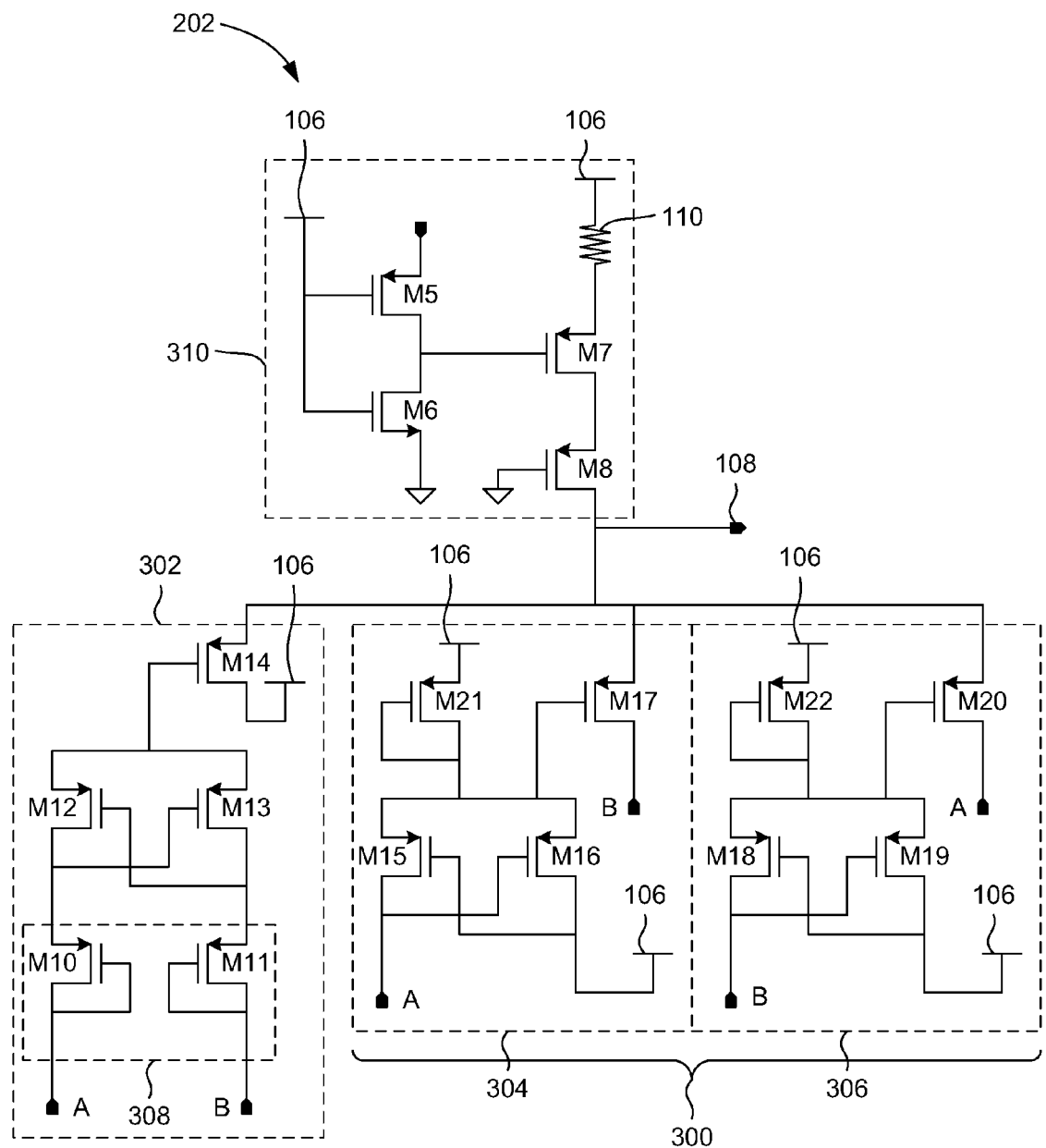
FIG. 3 depicts a schematic diagram of one embodiment of the voltage selector circuit of FIG. 2.

FIG. 3 depicts a schematic diagram of one embodiment of the voltage selector circuit 202 of FIG. 2. The voltage selector circuit 202 of FIG. 2 may be used in conjunction with any voltage generators, systems, or other electronic components. The output 108 of the voltage selector circuit 202 is a voltage value that may be used in additional components.

The voltage selector circuit 202 includes at least a first voltage selector 300 and a second voltage selector 302. The first voltage selector 300 is configured to compare voltage input A and voltage input B to the voltage comparison input 106. In one embodiment, the first voltage selector 300 includes a first detection circuit 304 and a second detection circuit 306. The first detection circuit 304 compares voltage input A to the voltage comparison input 106. The second detection circuit 306 compares voltage input B to the voltage comparison input 106. The voltage selector circuit 202 may use standard CMOS technology to compare the voltage values of the different voltage inputs. In one embodiment, the first voltage selector 300 and the second voltage selector 302 include PMOS transistors.

The first detection circuit 304 includes transistor M15, transistor M16, transistor M17, and transistor M21. The first detection circuit 304 receives voltage input A at the drain of transistor M15. The voltage comparison input 106—in the current embodiment, a supply voltage—is input into the drain of transistor M16. The drain of transistor M15 is connected to the gate of transistor M16, such that voltage input A is also input into the gate of transistor M16. The drain of transistor M16 is connected to the gate of transistor M15, such that the supply voltage is also input into the gate of transistor M15. If the voltage value of voltage input A is greater than the voltage value of the supply voltage, M15 conducts, and the voltage value of voltage input A is input to the gate of transistor M17. Consequently, if the voltage value of voltage input A or the voltage comparison input 106 is greater than the voltage value of voltage input B, transistor M17 is turned off.

Transistor M21 acts as a diode that receives a voltage value from the voltage comparison input 106. When voltage input A is equal to the voltage comparison input 106, the gate of transistor M17 is high ohmic. Transistor M21 is configured to ensure that the gate of transistor M17 is connected via the transistor M21 to the voltage comparison input 106.

If voltage input A is not greater than the voltage value of the supply voltage, transistor M16 conducts, and the voltage value of the supply voltage is input to the gate of M17. If the voltage value of voltage input B is greater than the voltage value of either voltage input A or the supply voltage, M17 will conduct, and the voltage value of voltage input B will be presented at the output 108.

The second detection circuit 306 includes transistor M18, transistor M19, transistor M20, and transistor M22. The second detection circuit 306 receives voltage input B at the drain of transistor M18. The voltage comparison input 106—in the current embodiment, the supply voltage—is input into the drain of transistor M19. The drain of transistor M18 is connected to the gate of transistor M19, such that voltage input B is also input into the gate of transistor M19. The drain of transistor M19 is connected to the gate of transistor M18, such that the supply voltage is also input into the gate of transistor M18. If the voltage value of voltage input B is greater than the voltage value of the supply voltage, M18 conducts, and the voltage value of voltage input B is input to the gate of transistor M20. Consequently, if the voltage value of voltage input B or the voltage comparison input 106 is greater than the voltage value of voltage input A, transistor M20 is turned off.

Transistor M22 acts as a diode that receives a voltage value from the voltage comparison input 106. When voltage input B is equal to the voltage comparison input 106, the gate of transistor M20 is high ohmic. Transistor M22 is configured to ensure that the gate of transistor M20 is connected via the transistor M21 to the voltage comparison input 106. If voltage input B is not greater than the voltage value of the supply voltage, transistor M16 conducts, and the voltage value of the supply voltage is input to the gate of M20. If the voltage value of voltage input A is greater than the voltage value of either voltage input B or the supply voltage, M20 will conduct, and the voltage value of voltage input A will be presented at the output 108. If the voltage value of either voltage input A and voltage input B are equal to the voltage value of the supply voltage, transistor M17 or transistor M20, or both, may be in high ohmic state.

The second voltage selector 302 also includes a detection circuit configured to compare voltage input A to voltage input B and output the highest of the two voltage inputs. The second voltage selector 302 is configured to trigger early based on a capacitance of the transistors in transient mode. Voltage input A is connected to the drain of transistor M10 and voltage input B is connected to the drain of transistor M11. The gate of transistor M10 is connected to its own drain, and the gate of transistor M11 is connected to its own drain.

The source of transistor M10 is connected to the drain of transistor M12 and the gate of transistor M13. The source of transistor M11 is connected to the drain of transistor M13 and the gate of transistor M12. Transistors M10 and M11 act as diodes to reduce the applied voltage to transistor M12 and transistor M13. Transistors M10 and M11 may also lower the total input capacitance of the second voltage selector 302. In one embodiment, other types of diodes or circuits may be used in place of transistors M10 and M11 to lower the voltages seen at the gates of transistor M12 and transistor M13. Specifically, the connection results in the gate capacitance of transistors M12 and M13 being in series with the source-drain capacitance of transistors M11 and M10, respectively, which lowers the overall capacitance of the second voltage selector 302. If the input to the gate of transistor M14 is higher than or substantially equal to the supply voltage, transistor M14 is turned off. If voltage input A is equal to voltage input B, the gate of transistor M14 receives a high ohmic input and is turned off. Transistor M14 may be turned on when the input to the gate of transistor M14 is lower than the supply voltage, causing transistor M14 to conduct the voltage value of the supply voltage.

Because the capacitance of the second voltage selector 302 is lowered due to the use of transistors M10 and M11, the second voltage selector 302 is able to switch on before the detection circuits of the first voltage selector 300 switch off and to take over the output 108 of the voltage selector circuit 202 before a high ohmic state is output for the voltage selector circuit 202. This results in improving the performance of the voltage selector circuit 202 by reducing the times when the output 108 is in high ohmic state. Furthermore, the voltage selector circuit 202 may include a bleeder circuit 310 to further improve the performance of the voltage selector circuit 202. The bleeder circuit 310 is configured to correct the output of the voltage selector circuit 202, in some circumstances, when the output of the detection circuit 102 would be a high ohmic (high impedance) value. The bleeder circuit 310 is capable of reducing the sensitivity of the voltage selector circuit 202 to high ohmic states at the output 108.

The bleeder circuit 310 may help narrow when the output 108 is high ohmic. In one embodiment, the bleeder circuit 310 includes a resistor 110 connected to the voltage comparison input 106. The resistor 110 may have a high resistance value. For example, the resistor 110 may have a resistor value in the mega-ohm range.

Transistor M7 and transistor M8 are connected in series with the resistor 110, and transistor M8 is connected to the output 108. In the current embodiment, the voltage comparison input 106 is connected to the supply voltage. The gate of transistor M8 is connected to ground. The gate of transistor M7 is connected to a circuit configured to input either ground or the voltage value of the output 108 to the gate of transistor M7.

In one embodiment, transistor M5 is a PMOS transistor and transistor M6 is an NMOS transistor. When the voltage supply is connected to the gates of transistor M5 and transistor M6 during normal operation, transistor M5 is turned off and transistor M6 is turned on, such that the gate of transistor M7 is connected to ground. Therefore, transistor M7, which is a PMOS transistor, is turned on during normal operation. The current from the bleeder circuit 310 may thus be determined by the resistance value of the resistor 110 and the transistor characteristics of transistor M6.

During an Ioff test, input pins are connected to ground except for the pin under test—for example, voltage input A or voltage input B. The current in the pin under test is measured, typically having a value in the nano-ampere (nA) range. The output 108 of the voltage selector circuit 202 is equal to the applied voltage value of voltage input A. When performing the Ioff test, the bleeder circuit 310 may be turned off to prevent the bleeder circuit 310 from influencing the current of the Ioff test. The gates of transistor M5 and transistor M6 are connected to ground, transistor M5 is turned on and transistor M6 is turned off. Because transistor M5 is turned on, transistor M5 conducts the output 108 of the conventional voltage selector circuit 100 to the gate of transistor M7, turning transistor M7 off, and the bleeder circuit 310 is disconnected from the output 108.

In various embodiments, the voltage selector circuit 202 may be configured to output the highest voltage value of the three inputs or the lowest voltage value (not shown) of the three inputs. This may require exchanging PMOS transistors in the detection circuits with NMOS transistors and connecting the voltage comparison input pins of the detection circuits and the bleeder circuit 104 to ground, rather than the supply voltage.

Figure 4:
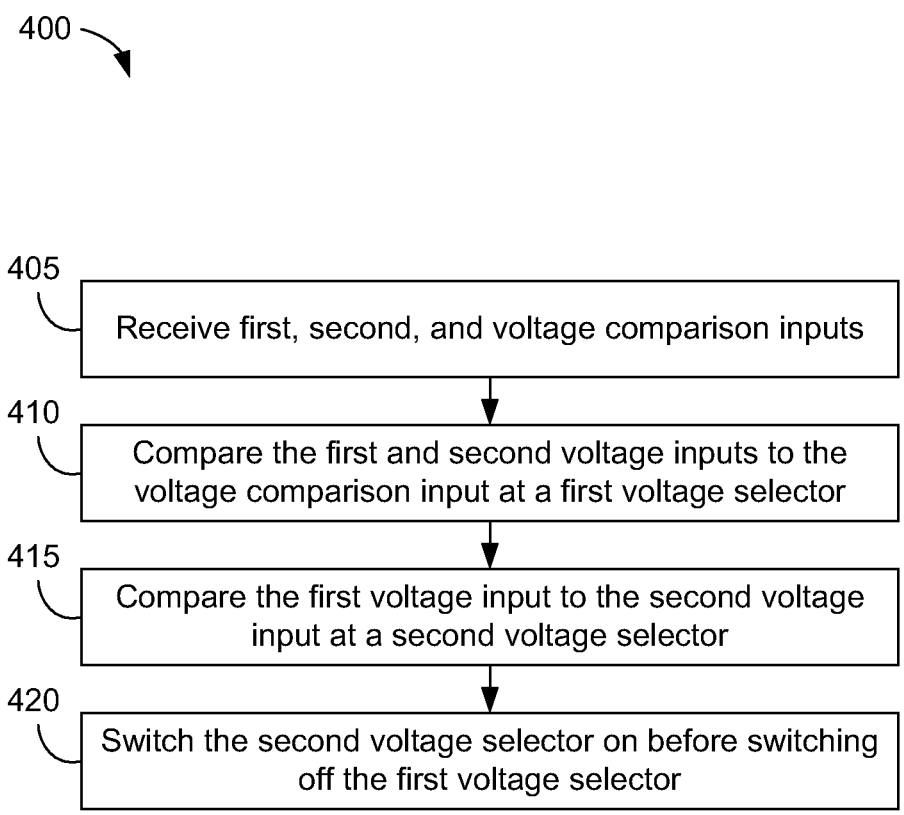
FIG. 4 depicts a flowchart diagram of one embodiment of a method for selecting a voltage input.

FIG. 4 depicts a flowchart diagram of one embodiment of a method 400 for selecting a voltage input. Although the method 400 is described in conjunction with the voltage selector circuit 202 of FIG. 2, the method 400 may be used in conjunction with any type of voltage selector circuit 202.

The voltage selector circuit 202 is configured to receive 405 the first voltage input, the second voltage input, and the voltage comparison input 106. The voltage inputs may be generated using any type of voltage generator configured to output a specific voltage level. While such voltage levels are intended to be an exact value, the actual voltage values output by the voltage generators 204, 206 may vary due to various factors.

The voltage selector circuit 202 then compares 410 the first voltage input and the second voltage input to the voltage comparison input 106 at the first voltage selector 300. The first voltage selector 300 is connected to the output 108 of the voltage selector circuit 202. The output 108 of the voltage selector circuit 202 may be connected to any number or type of different circuits which may use the voltage output by the voltage selector circuit 202. The first voltage selector 300 may include a first detection circuit 304 and a second detection circuit 306. The first detection circuit 304 may be configured to compare the first voltage input to the voltage comparison input 106. The second detection circuit 306 may be configured to compare the second voltage input to the voltage comparison input 106. In one embodiment, the outputs of the detection circuits are connected to the output 108 of the voltage selector circuit 202.

The voltage selector circuit 202 also includes a second voltage selector 302. The voltage selector circuit 202 compares 415 the first voltage input to the second voltage input at the second voltage selector 302 using an early trigger. The second voltage selector 302 is configured to trigger early by switching 420 on before the first voltage selector 300 switches off. When the first voltage selector 300 switches off, the output values of the detection circuits may be a high ohmic output, depending on the resulting comparisons. The second voltage selector 302 is also connected to the output 108, such that the voltage selector circuit 202 may output the voltage value corresponding to the highest or lowest voltage input, including the voltage comparison input 106.

The second voltage selector 302 includes a pair 308 of diodes at the first voltage input and the second voltage input to the detection circuit of the second voltage selector 302. The voltage selector circuit 202 initiates the early trigger using the pair 308 of diodes. In other embodiments, other components may be used to cause a required voltage drop other than the pair 308 of diodes. The second voltage selector 302 is operated in transient mode. The early trigger is based on the capacitance of the second voltage selector 302. By placing the diodes at the first and second voltage inputs, the capacitance corresponding to the diodes is place in series with the capacitance of the transistors in the detection circuit of the second voltage selector 302, thereby reducing the overall capacitance of the second voltage selector 302. Lowering the overall capacitance may reduce the response time of the second voltage selector 302, so that it may trigger earlier than the second voltage selector 302 would have otherwise triggered without the diodes. The diodes may be selected with specific values that reduce the response time so that the second voltage selector 302 triggers, or switches on, at the appropriate time before the first voltage selector 300 switches off.

In one embodiment, the voltage selector circuit 202 includes a bleeder circuit 104 connected to the output 108 of the voltage selector circuit 202. The bleeder circuit 104 helps reduce the high ohmic state of the output voltage of the voltage selector circuit 202. The bleeder circuit 104 may include a resistor 110 connected to the voltage comparison input 106 and in series with at least one transistor. The transistors are located between the resistor 110 and the output 108 of the voltage selector circuit 202. At least one of the transistors may be used to turn the bleeder circuit 104 on and off by turning the transistor off and stopping current from flowing through the resistor 110. An additional transistor M8 may be used as a pseudo resistor in the bleeder circuit 104, though transistor M8 may be replaced with an actual resistor. The bleeder circuit 104 may affect the output 108 of the voltage selector circuit 202 based on the resistor value. The transistors in the bleeder circuit 104 and any inputs into the bleeder circuit transistors may also affect the output 108 of the voltage selector circuit 202.

In one embodiment, the voltage selector circuit 202 is configured to determine the highest voltage from the first voltage input, the second voltage input, and the voltage comparison input 106. The voltage comparison input 106 for such an embodiment may include a supply voltage input. The transistors of the voltage detectors may be PMOS transistors connected to the supply voltage input in this embodiment. Additionally, the resistor 110 of the bleeder circuit 104 is connected to the supply voltage input, and the bleeder circuit 104 is configured to conduct a minute amount of current via the supply voltage input to the output 108.

In one embodiment, the voltage selector circuit 202 is configured to determine the lowest voltage from the first voltage input, the second voltage input, and the voltage comparison input 106. The voltage comparison input 106 for such an embodiment may include a ground input. The transistors of the voltage detectors may be NMOS transistors connected to the ground input in this embodiment. Additionally, the resistor 110 of the bleeder circuit 104 is connected to the ground input, and the bleeder circuit 104 is configured to conduct current via the ground input and the output 108. The bleeder circuit 104 in this embodiment may use a single NMOS transistor in series with the resistor 110. The gate of the NMOS transistor may be connected to the supply voltage input.

In some embodiments, more than one voltage selector circuit 202 may be implemented to select either the highest or the lowest voltage from a plurality of voltage inputs. Other embodiments may implement any number of voltage selector circuit 202s to select highest or lowest voltages from a variety of voltage inputs.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A voltage selector circuit, comprising:
a first voltage input, a second voltage input, and a voltage comparison input;
a first voltage selector connected to an output, wherein the first voltage selector is configured to compare the first voltage input and the second voltage input to the voltage comparison input; and
a second voltage selector connected to the output, wherein the second voltage selector is configured to compare the first voltage input to the second voltage input using an early trigger, wherein the second voltage selector is configured to switch on before the first voltage selector switches off; and
wherein the second voltage selector further comprises a pair of diodes at the first voltage input and the second voltage input of a detection circuit, wherein the pair of diodes is configured to initiate the early trigger.

2. The circuit of claim 1, wherein the first voltage selector and the second voltage selector are configured to determine a lowest voltage of the first voltage input, the second voltage input, and the voltage comparison input, wherein the voltage comparison input comprises a ground input.

3. The circuit of claim 1, wherein the first voltage selector and the second voltage selector are configured to determine a highest voltage of the first voltage input, the second voltage input, and the voltage comparison input, wherein the voltage comparison input comprises a supply voltage input.

4. The circuit of claim 1, wherein the first voltage selector comprises a first detection circuit and a second detection circuit, wherein the first detection circuit is configured to compare the first voltage input to the voltage comparison input, and the second detection circuit is configured to compare the second voltage input to the voltage comparison input.

5. A voltage selector circuit, comprising:
a first voltage input, a second voltage input, and a voltage comparison input;
a first voltage selector connected to an output, wherein the first voltage selector is configured to compare the first voltage input and the second voltage input to the voltage comparison input; and
a second voltage selector connected to the output, wherein the second voltage selector is configured to compare the first voltage input to the second voltage input using an early trigger, wherein the second voltage selector is configured to switch on before the first voltage selector switches off; and
a bleeder circuit connected to an output of the voltage selector circuit.

6. The circuit of claim 5, wherein the early trigger is based on a capacitance of the second voltage selector, wherein the second voltage selector is further configured to operate in transient mode.

7. A method for selecting a voltage input, comprising:
receiving a first voltage input, a second voltage input, and a voltage comparison input;
comparing the first voltage input and the second voltage input to the voltage comparison input at a first voltage selector, wherein the first voltage selector is connected to an output; and
comparing the first voltage input to the second voltage input at a second voltage selector using an early trigger, wherein the second voltage selector is configured to switch on before the first voltage selector switches off, wherein the second voltage selector is connected to the output; and
wherein the second voltage selector further comprises a pair of diodes at the first voltage input and the second voltage input of a detection circuit, wherein the method further comprises initiating the early trigger using the pair of diodes.

8. The method of claim 7, further comprising reducing a high impedance state of the output of the voltage selector circuit via a bleeder circuit connected to the output of a voltage selector circuit.

9. The method of claim 7, further comprising determining a lowest voltage of the first voltage input, the second voltage input, and the voltage comparison input, wherein the voltage comparison input comprises a ground input.

10. The method of claim 7, further comprising determining a highest voltage of the first voltage input, the second voltage input, and the voltage comparison input, wherein the voltage comparison input comprises a supply voltage input.

11. A method for selecting a voltage input, comprising:
receiving a first voltage input, a second voltage input, and a voltage comparison input;
comparing the first voltage input and the second voltage input to the voltage comparison input at a first voltage selector, wherein the first voltage selector is connected to an output; and
comparing the first voltage input to the second voltage input at a second voltage selector using an early trigger, wherein the second voltage selector is configured to switch on before the first voltage selector switches off, wherein the second voltage selector is connected to the output;
comparing the first voltage input to the voltage comparison input in a first detection circuit of the first voltage selector; and
comparing the second voltage input to the voltage comparison input in a second detection circuit of the first voltage selector.

12. The method of claim 11, further comprising, operating the second voltage selector in transient mode, wherein the early trigger is based on a capacitance of the second voltage selector.

13. A system, comprising:
a first voltage generator configured to generate a first voltage input:
a second voltage generator configured to generate a second voltage input; and
a voltage selector circuit, comprising:
a first voltage selector connected to an output of the voltage selector circuit, wherein the first voltage selector is configured to compare the first voltage input and the second voltage input to a voltage comparison input; and
a second voltage selector connected to the output, wherein the second voltage selector is configured to compare the first voltage input to the second voltage input using an early trigger, wherein the second voltage selector is configured to switch on before the first voltage selector is switched off; and
wherein the second voltage selector further comprises a pair of diodes at the first voltage input and the second voltage input of a detection circuit, wherein the pair of diodes is configured to initiate the early trigger.

14. The device of claim 13, wherein the first voltage selector and the second voltage selector are configured to determine a lowest voltage of the first voltage input, the second voltage input, and the voltage comparison input, wherein the voltage comparison input comprises a ground input.

15. The device of claim 13, wherein the first voltage selector and the second voltage selector are configured to determine a highest voltage of the first voltage input, the second voltage input, and the voltage comparison input, wherein the voltage comparison input comprises a supply voltage input.

16. The device of claim 13, wherein the first voltage selector comprises a first detection circuit and a second detection circuit, wherein the first detection circuit is configured to compare the first voltage input to the voltage comparison input, and the second detection circuit is configured to compare the second voltage input to the voltage comparison input.

17. A system, comprising:
- a first voltage generator configured to generate a first voltage input;
- a second voltage generator configured to generate a second voltage input; and
- a voltage selector circuit, comprising:
  - a first voltage selector connected to an output of the voltage selector circuit, wherein the first voltage selector is configured to compare the first voltage input and the second voltage input to a voltage comparison input; and
  - a second voltage selector connected to the output, wherein the second voltage selector is configured to compare the first voltage input to the second voltage input using an early trigger, wherein the second voltage selector is configured to switch on before the first voltage selector is switched off; and
- wherein the early trigger is based on a capacitance of the second voltage selector, wherein the second voltage selector is further configured to operate in transient mode.

* * * * *